(12) United States Patent
Cecco et al.

(10) Patent No.: US 9,817,052 B2
(45) Date of Patent: Nov. 14, 2017

(54) METHOD AND CIRCUIT FOR DETERMINING DISPERSION OF ELECTRIC POWER TOWARDS GROUND IN ELECTRIC APPLIANCES

(71) Applicant: Electrolux Appliances Aktiebolag, Stockholm (SE)

(72) Inventors: Alessandro Cecco, Sedegliano (IT); Paolo Driussi, Zoppola (IT)

(73) Assignee: Electrolux Appliances Aktiebolag, Stockholm (SE)

( * ) Notice: Subject to any disclaimer, the term of this patent is extended or adjusted under 35 U.S.C. 154(b) by 112 days.

(21) Appl. No.: 14/780,350

(22) PCT Filed: Mar. 25, 2014

(86) PCT No.: PCT/EP2014/055988
§ 371 (c)(1),
(2) Date: Sep. 25, 2015

(87) PCT Pub. No.: WO2014/154709
PCT Pub. Date: Oct. 2, 2014

(65) Prior Publication Data
US 2016/0054369 A1 Feb. 25, 2016

(30) Foreign Application Priority Data

Mar. 28, 2013 (EP) ..................................... 13161741

(51) Int. Cl.
*G01R 31/02* (2006.01)
*G05B 9/02* (2006.01)
(Continued)

(52) U.S. Cl.
CPC ........... *G01R 31/025* (2013.01); *D06F 37/42* (2013.01); *G05B 9/02* (2013.01); *H02H 3/162* (2013.01);
(Continued)

(58) Field of Classification Search
USPC .................. 324/509–511, 522; 318/106, 107
See application file for complete search history.

(56) References Cited

U.S. PATENT DOCUMENTS 5,378,874 A * 1/1995 Holling .................. G08C 25/02
219/414
6,057,996 A 5/2000 Kim
(Continued)

FOREIGN PATENT DOCUMENTS

EP 0299114 A1 1/1989

OTHER PUBLICATIONS

International Search Report dated May 26, 2014 in corresponding International Application No. PCT/EP2014/055988.

*Primary Examiner* — Vincent Q Nguyen
(74) *Attorney, Agent, or Firm* — Banner & Witcoff, Ltd.

(57) ABSTRACT

An electric appliance (100) is disclosed. The electric appliance has an electric load (205), and a driving element (215) for selectively energizing/de-energizing the electric load (205). The driving element (215) has a first driving terminal ($A_1$) coupled to a first load terminal ($T_1$) of the electric load, a second driving terminal ($A_2$) coupled to a first power supply terminal ($T_N$), and a control terminal (G) for switching on/off the driving element (215) thereby allowing said selective energization/de-energization, respectively. The electric appliance also has a switching element (230) for selectively coupling a second power supply terminal ($T_L$) to a second load terminal ($T_2$) of the electric load (205). The electric appliance (100) further has a detection arrangement (210,220) configured for detecting a first electrical quantity ($V_{A1}$) at the first driving terminal ($A_1$), and at least one between a second electrical quantity ($V_{T2,CL}, V_{T2,OP}$) at the second load terminal ($T_2$) and a power supply electrical quantity ($V_{MAINS}$) at the second power supply terminal ($T_L$). The detection arrangement (210,220) has a coupling element
(Continued)

(220) coupling the first driving terminal ($A_1$) to the second load terminal ($T_2$), and a control unit (210) coupled to the first driving terminal ($A_1$), and to at least one between the second load terminal ($T_2$) and the second power supply terminal ($T_L$). The control unit (210) is further configured for determining dispersion of electric power towards ground in the electric load (205) according to the detected electrical quantities.

20 Claims, 2 Drawing Sheets (51) Int. Cl.
| | | |
|---|---|---|
| H02H 3/16 | (2006.01) | |
| D06F 37/42 | (2006.01) | |
| G01R 31/28 | (2006.01) | |
| D06F 33/02 | (2006.01) | |
| D06F 37/30 | (2006.01) | |

(52) U.S. Cl.
CPC ............ *D06F 33/02* (2013.01); *D06F 37/304* (2013.01); *D06F 2202/12* (2013.01); *D06F 2204/10* (2013.01); *D06F 2210/00* (2013.01); *G01R 31/2825* (2013.01)

(56) References Cited

U.S. PATENT DOCUMENTS

| | | | |
|---|---|---|---|
| 2003/0052627 A1* | 3/2003 | Raimondi | D06F 37/304 318/107 |
| 2009/0135531 A1* | 5/2009 | Hirata | H02H 3/093 361/18 |
| 2011/0163759 A1 | 7/2011 | Ishii et al. | |
| 2013/0062968 A1 | 3/2013 | Lovisotto et al. | |

* cited by examiner

METHOD AND CIRCUIT FOR DETERMINING DISPERSION OF ELECTRIC POWER TOWARDS GROUND IN ELECTRIC APPLIANCES

FIELD OF THE INVENTION

The present invention generally relates to electric appliances, such as washing, drying, washing/drying, dishwashing machines, both for domestic and professional use. More particularly, the present invention relates to determination of electrical faults, such as power dispersion towards earth or ground, in such electric appliances.

BACKGROUND

Each electric household and professional appliance (hereinafter, appliance, for the sake of conciseness) typically comprises an inner compartment accommodating a rotating drum accessible by a user for loading items (e.g., laundry or dishware) to be treated (e.g., washed and/or dried) and unloading the items after the intended treatment has been accomplished, as well as electric/electro-mechanical components (e.g., electric motors, electric heating resistors) for accomplishing the intended treatment.

As known, such components, coupled between line and neutral potentials of an AC electric power supply, may be affected by phenomena of dispersion of electric power towards ground.

Considering for example insulation failure arising in electric motors (e.g., due to usage wear, overheating, contaminants and/or mechanical stress), undesired electric power (e.g., electric current) may leak towards ground (leakage current).

The leakage current, apart from increasing power consumption, may pose safety hazards. Indeed, while leaking towards ground, the leakage current may also flow through appliance portions that are intended to be non-conductive (often, easily accessible by a user) under normal conditions.

The dispersion of electric power towards ground is to be avoided, since in case the AC distribution network in the user premises where the electric appliance is installed is properly protected, the protection devices intervene and cause the de-energization of all or at least sections of the user premises; even worse, when no proper protection exists, the risk of electric shock for the user is very high.

Most of solutions known in the art are based on leakage current monitoring. As soon as the monitored leakage current has risen a critical value, an alert condition is signaled (possibly, by displaying a proper error code), and the electric appliance operation aborted.

For example, JP2006177973 discloses a monitoring based on sensing a common mode leakage current flowing in a ground wire cable of a motor controller circuit, generating an average leakage current signal from the sensed common mode leakage current, converting the average leakage current into a first PWM signal, generating pulse signals at the rising and falling edges of the first PWM signal, transposing the rising edge and falling edge of the pulse signals to a voltage referenced to ground, and reconstructing (from the pulse signals) a second PWM signal whose duty cycle varies according to the magnitude of the common mode leakage current.

SUMMARY OF SELECTED INVENTIVE ASPECTS

The Applicant has realized that the known solutions are not satisfactory for modern technological requirements.

In particular, according to the Applicant, determination of dispersion of electric power towards ground based on leakage current monitoring is not efficient, as requiring relatively high computational processing (and thus relatively high circuit complexity).

Indeed, as far as JP2006177973 is concerned, current transformers (for sensing the common mode leakage current), low-pass filters (for generating the average leakage current signal), PWM converters (for providing the first PWM signal), pulse generators (for generating the pulse signals), level shifters (for transposing the pulse signals), and pulse reconstruction circuits (for providing the second PWM signal) are required.

Due to high complexity, leakage current monitoring circuit can not be easily and costlessly replicated for determining dispersions of electric power towards ground possibly originating from other electric loads (e.g., pumps, heating resistors and the like). Thus, such approach has very limited practical applications.

Last but not least, modern electric appliances, as featuring a higher and higher number of functionalities for the same (or even lower) space occupation, are required to be as simple and low-pieces as possible.

The Applicant has tackled the problem of devising a satisfactory solution able to overcome the above-discussed drawbacks.

The Applicant has found that some electric signals already available in the electric appliance can be exploited for determining/inferring dispersion of power towards ground of electric loads, provided that a circuit system with proper connections/couplings is devised for such electric loads.

In other words, the Applicant has devised a circuit system (including electric loads, such as electric motor for drum rotation) which is simple and low-pieces as those featuring no sophisticated sensing and processing circuits, and a method for determining/inferring dispersion of power towards ground if some, apparently uncorrelated, electric signals (e.g., power supply signal, electric motor triac signals, door lock signals) are in certain relationships between each other.

One or more aspects of the solution according to embodiments of the present invention are set out in the independent claims, with advantageous features of the same solution that are indicated in the dependent claims (with any advantageous feature provided with reference to a specific aspect of the solution according to an embodiment of the invention that applies mutatis mutandis to any other aspect thereof).

An aspect of the solution according to one or more embodiments of the present invention relates to an electric appliance. The electric appliance comprises an electric load, and a driving element for selectively energizing/de-energizing the electric load. The driving element has a first driving terminal coupled to a first load terminal of the electric load, a second driving terminal coupled to a first power supply terminal, and a control terminal for switching on/off the driving element thereby allowing said selective energization/de-energization, respectively. The electric appliance also comprises a switching element for selectively coupling a second power supply terminal to a second load terminal of the electric load. The electric appliance further comprises a detection arrangement configured for detecting a first electrical quantity at the first driving terminal, and at least one between a second electrical quantity at the second load terminal and a power supply electrical quantity at the second power supply terminal. The detection arrangement comprises a coupling element coupling the first driving terminal to the second load terminal, and a control unit coupled to the first driving terminal, and to at least one between the second load terminal and the second power supply terminal. The control unit is further configured for determining dispersion of electric power towards ground in the electric load according to the detected electrical quantities.

According to an embodiment of the present invention, the control unit is configured for comparing the first electrical quantity to at least one between the second electrical quantity and the power supply electrical quantity, and determining dispersion of electric power towards ground in the electric load according to a result of such comparison.

According to an embodiment of the present invention, the control unit is further configured for extracting pick values of the detected electrical quantities, wherein said comparing comprises comparing the pick value of the first electrical quantity to at least one between the pick value of the second electrical quantity and the pick value of the power supply electrical quantity.

According to an embodiment of the present invention, the switching element is operable to allow/prevent electrical coupling between the second load terminal and the second power supply terminal according to a closed/opened configuration, respectively, of an appliance door. The pick value of the second electrical quantity takes a first peak value indicative of the closed configuration, or a second peak value indicative of the opened configuration.

According to an embodiment of the present invention, in the closed configuration said comparing comprises comparing the pick value of the first electrical quantity to the first peak value, and said determining comprises determining dispersion of electric power towards ground in the electric load if the pick value of the first electrical quantity exceeds the first peak value at least by a first threshold value.

According to an embodiment of the present invention, in the opened configuration said comparing comprises comparing the pick value of the first electrical quantity to the second peak value, and comparing the pick value of the first electrical quantity to the pick value of the power supply electrical quantity, and said determining comprises determining dispersion of electric power towards ground in the electric load if the pick value of the first electrical quantity exceeds the second peak value at least by a second threshold value and the pick value of the power supply electrical quantity at least by a third threshold value.

According to an embodiment of the present invention, in the closed configuration, the second power supply terminal and the second load terminal are substantially short-circuited to each other so that the first peak value substantially equals the pick value of the power supply electrical quantity, and in the opened configuration, the second power supply terminal and the second load terminal are substantially isolated from each other so that the second peak value is lower than the pick value of the power supply electrical quantity.

According to an embodiment of the present invention, said comparing comprises comparing the pick value of the first electrical quantity to the pick value of the power supply electrical quantity, and said determining comprises determining dispersion of electric power towards ground in the electric load if the pick value of the first electrical quantity exceeds the pick value of the power supply electrical quantity at least by a threshold voltage.

According to an embodiment of the present invention, the driving element comprises a triac.

According to an embodiment of the present invention, the detection arrangement is further configured for detecting a triac current for monitoring triac operation, and the control unit is configured further for determining dispersion of electric power towards ground in the electric load also based on the detected triac current.

According to an embodiment of the present invention, said detecting a first electrical quantity at the first driving terminal, and at least one between a second electrical quantity at the second load terminal and a power supply electrical quantity at the second power supply terminal, said extracting pick values of the detected electrical quantities, and said comparing the first electrical quantity to at least one between the second electrical quantity and the power supply electrical quantity, are performed upon detection of predefined variations of triac current.

According to an embodiment of the present invention, the electric load comprises an electric motor.

According to an embodiment of the present invention, the electric appliance comprises a washing machine, a drying machine, or a washing/drying machine.

According to an embodiment of the present invention, the electric appliance comprises a rotating drum adapted to house laundry to be washed and/or dried, and the electric load comprises an electric motor for drum rotation.

Another aspect of the solution according to one or more embodiments of the present invention relates to a method for determining dispersion of electric power towards ground in an electric appliance. The electric appliance comprises an electric load, and a driving element for selectively energizing/de-energizing the electric load. The driving element has a first driving terminal coupled to a first load terminal of the electric load, a second driving terminal coupled to a first power supply terminal, and a control terminal for switching on/off the driving element thereby allowing said selective energization/de-energization, respectively. The electric appliance further comprises a switching element for selectively coupling a second power supply terminal to a second load terminal of the electric load, and a control unit configured for controlling the driving element and the switching element. The method comprises, under the control of the control unit, the following steps:

comparing a first electrical quantity at the first driving terminal to at least one between a second electrical quantity at the second load terminal and a power supply electrical quantity at the second power supply terminal, and determining dispersion of electric power towards ground in the electric load according to a result of such comparison.

According to an embodiment of the present invention, the method further comprises extracting pick values of the first electrical quantity and of at least one between the second electrical quantity and the power supply electrical quantity. Said comparing comprises comparing the pick value of the first electrical quantity to at least one between the pick value of the second electrical quantity and the pick value of the power supply electrical quantity.

According to an embodiment of the present invention, the pick value of the second electrical quantity can take a first peak value indicative of a closed configuration of an appliance door, or a second peak value indicative of an opened configuration of the appliance door. In the closed configuration said comparing comprises
comparing the pick value of the first electrical quantity to the first peak value, and
said determining comprises
determining dispersion of electric power towards ground in the electric load if the pick value of the first electrical quantity exceeds the first peak value at least by a first threshold value.

According to an embodiment of the present invention, in the opened configuration said comparing comprises
comparing the pick value of the first electrical quantity to the second peak value, and
comparing the pick value of the first electrical quantity to the pick value of the power supply electrical quantity, and
said determining comprises
determining dispersion of electric power towards ground in the electric load if the pick value of the first electrical quantity exceeds the second peak value at least by a second threshold value and the pick value of the power supply electrical quantity at least by a third threshold value.

Thanks to aspects of the present invention, the dispersion of electric power towards ground affecting a selected electric load is easily determined as soon as it takes place, and in different conditions of the electric appliance (e.g., in both opened and closed configurations of the appliance door). Therefore, aspects of the present invention quickly determines dispersion of electric power towards ground (both when the electric load is energized and de-energized), thus avoiding intervention of protection devices and making the user safe from electric shock when no proper protection devices exist. This has been achieved without substantially requiring any additional dedicated circuits or further computational complexity, as based on a simple circuit system exploiting basic components and on comparison of electric signals already available in it.

BRIEF DESCRIPTION OF THE DRAWINGS

These and other features and advantages of the present invention will be made apparent by the following description of some exemplary and non limitative embodiments thereof; for its better intelligibility, the following description should be read making reference to the attached drawings, wherein.

DETAILED DESCRIPTION OF EXAMPLE EMBODIMENTS

Figure 1:
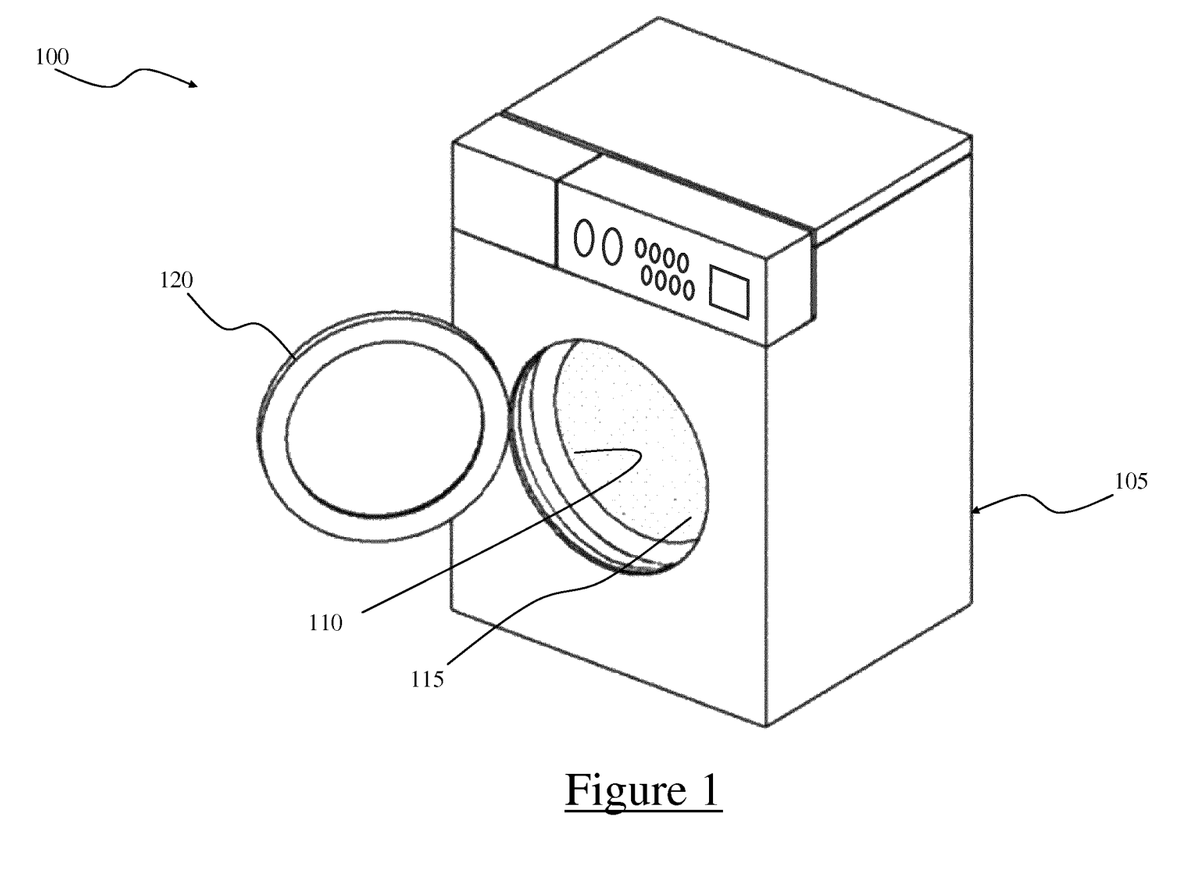
FIG. 1 schematically shows an electric appliance wherein the solution according to one or more embodiments of the present invention may be applied, and FIG. 2 schematically shows a portion of a circuit system of the electric appliance according to an embodiment of the present invention.

Referring now to the drawings, FIG. 1 schematically shows an electric appliance or, shortly, appliance 100, for example for domestic use (i.e., a household appliance), wherein the solution according to one or more embodiments of the present invention may be applied. The appliance 100 may for example be a washing machine (as generically illustrated in the figure, and to which reference will be made in the following by way of a non-limiting example only), a washing/drying machine or a drying machine—however, as will be best understood in the following, the principles of the present invention may also apply to any other electric appliance generally equipped with electric loads that, powered by an electric power supply, could be intrinsically subjected to phenomena of dispersion of electric power towards ground.

The appliance 100 preferably comprises a substantially parallepiped-shaped cabinet 105, which encloses an inner compartment 110.

The inner compartment 110 accommodates a e.g. rotating drum 115 apt to house items to be treated (such as laundry to be washed and/or dried), and accessible through an access door 120 (shown in an opened configuration) preferably provided on a front panel of the cabinet 105 for loading/unloading the items.

The inner compartment 110 also accommodates, not visible in such figure, a number of well-known electronic, electro-hydraulic and/or electro-mechanical components, which form (as a whole) a circuit system allowing operation of the electric appliance 100.

Figure 2:
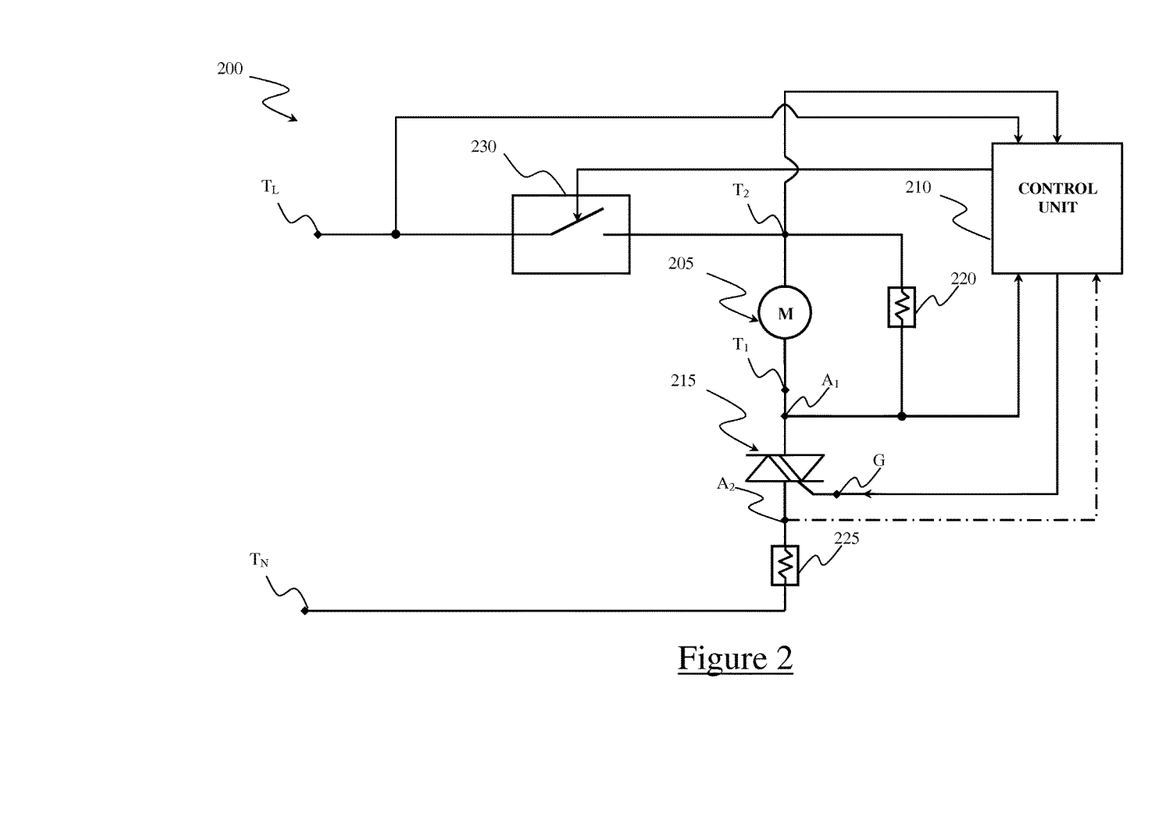

Hereinafter, reference will be also made to FIG. 2, which schematically shows a portion of a circuit system 200 according to an embodiment of the present invention.

The circuit system 200 comprises electric loads, such has the electric load 205, allowing operation of the electric appliance 100, as well as a control unit 210 allowing (among other things) selective control of the electric loads.

The electric load 205, schematically illustrated as a generic block between two load terminals $T_1, T_2$, is not limiting for the present invention. In the example at issue, the electric load 205 is a motor assembly, e.g. for drum 115 rotation, that can be selectively coupled between line $T_L$ and neutral $T_N$ terminals providing an AC electric power supply (e.g., a 230V or 125V alternating voltage at a 50 Hz or 60 Hz frequency), whereas the control unit 210 is a microcontroller/microprocessor powered by proper DC electric power supplies (e.g., 3V, 5V or 12V DC supply voltages with respect to a reference, ground voltage—for example, 0V), preferably obtained by known AC electric power supply conditioning (conditioning circuits not shown).

As usual, the motor assembly 205 may comprise an electric motor (e.g., including stator and rotor, not shown), as well as a number of electrically-operated switching devices (not shown) for allowing operation thereof. Such switching devices typically comprise relays adapted to switch electric motor configuration (so as to allow rotation thereof according to different directions).

The circuit system 200 further comprises a driving element 215 (e.g., a triac) adapted to allow selective energization/de-energization of the motor assembly 205. The triac 215 comprises a first driving (anode) terminal $A_1$ coupled to the load terminal $T_2$ of the motor assembly 205 (preferably, through resistive coupling 220) and to the load terminal $T_1$ (preferably, directly), a second anode terminal $A_2$ coupled to the neutral terminal $T_N$ (preferably, through a further resistive coupling 225), and a gate terminal G coupled to the control unit 210 for receiving a control signal (not shown). According to well known electronic principles, the triac 215 is switched on/off (thus, causing energization/de-energization of the motor assembly 205, respectively) depending on a value of the control signal.

The circuit system 200 also comprises a door lock device 230, provided between the line terminal $T_L$ and the motor assembly 205 (i.e., the load terminal $T_2$ thereof), and acting as security means for preventing the motor assembly 205 (and/or any other electric loads downstream the door lock device 230) from being operated while the door 120 is open, and for preventing door 120 opening during operation of the motor assembly 205 (and/or of any other electric loads downstream the door lock device 230).

The door lock device 230 preferably comprises a mechanical, electromechanical or magnetic switch whose switching on/off is controlled by (e.g., a further control signal, not shown, from) the control unit 210—possibly, by energization/de-energization provided by a further triac, not shown. Switching on of the door lock device 230 (closed configuration of the door 120) causes line terminal $T_L$/load terminal $T_2$ electric coupling, whereas switching off of the door lock device 230 (opened configuration of the door 120) causes line terminal $T_L$/load terminal $T_2$ electric decoupling.

Operation of the circuit system 200 being relevant for understanding aspects of the present invention may be summarized as follows.

In the opened configuration, the triac 215 and the door lock device 230 are both off (as the respective control signals from the control unit 210 so impose), thus no electric current flows across the motor assembly 205. In terms of electrical quantities (e.g., voltages), line $T_L$ and neutral $T_N$ terminals oscillate at Mains supply voltage (hereinafter referred to as voltage $V_{MAINS}$), whereas load terminal $T_2$, due to line terminal $T_L$/load terminal $T_2$ electric decoupling, is at a voltage $V_{T2,OP}$ (e.g., having same frequency as, but lower amplitude range than, voltage $V_{MAINS}$) indicative of the opened configuration. Due to anode terminal $A_1$/load terminal $T_2$ and to anode terminal $A_2$/neutral terminal $T_N$ electric couplings, a voltage drop depending on $V_{MAINS}$ and $V_{T2,OP}$ is provided across the triac 215.

In the closed configuration, the triac 215 and the door lock device 230 are both on (as the respective control signals from the control unit 210 so impose). As before, line terminal $T_L$ is at the voltage $V_{MAINS}$, whereas load terminal $T_2$, due to line terminal $T_L$/load terminal $T_2$ electric coupling, will rise to a voltage $V_{T2,CL}$ (e.g., substantially equal to the voltage $V_{MAINS}$) indicative of the closed configuration—as should be readily understood, the voltage $V_{T2,CL}$ will be closer to the voltage $V_{MAINS}$ the more the "transfer function" between the line terminal $T_L$ and the load terminal $T_2$ is close to one. Due to anode terminal $A_1$/load terminal $T_2$ and anode terminal $A_2$/neutral terminal $T_N$ electric couplings, a voltage drop depending on $V_{MAINS}$ and $V_{T2,CL}$ is provided across the triac 215, which generates an electric current (not shown) driving the electric motor 205.

According to aspects of the present invention, the control unit 210 is coupled to the anode terminal $A_1$ and, depending on the implementation, to the load terminal $T_2$ and/or to the line terminal $T_L$ (and possibly to the anode terminal $A_2$, connection shown in dash-and-dot line, as will be discussed below), for taking corresponding electrical quantities therefrom. Thus, the control unit 210 acts, together with the (resistive) coupling element 220, as a detection arrangement for detecting the voltage at the anode terminal $A_1$, or voltage $V_{A1}$, and depending on the implementation, the voltage $V_{T2,OP}/V_{T2,CL}$ and/or the voltage $V_{MAINS}$ (and, possibly, a triac 215 current).

Upon said detection, the control unit 210 compares the voltage $V_{A1}$ to at least one between the voltage $V_{T2,OP}/V_{T2,CL}$ and the voltage $V_{MAINS}$, and determines/infers dispersion of power towards ground in the motor assembly 205 according to a result of such comparison.

Preferably, the control unit 210 extracts (e.g., at each predefined time slot) pick values of the detected voltages (namely, the voltage $V_{A1}$, the voltage $V_{T2,OP}/V_{T2,CL}$ and/or the voltage $V_{MAINS}$), and performs said comparisons by using the extracted pick values—i.e., the control unit 210 compares the peak value of voltage $V_{A1}$ (or peak value $\underline{V}_{A1}$) to at least one between the peak value of the voltage $V_{T2,OP}/V_{T2,CL}$ (or peak value $\underline{V}_{T2,OP}/\underline{V}_{T2,CL}$, respectively) and the peak value of the voltage $V_{MAINS}$ (or peak value $\underline{V}_{MAINS}$). This allows obtaining reliable and quick comparisons, thus easy and responsive results.

The predefined time slot can be set according to specific requirements. However, in the exemplarily considered arrangement, the voltages $V_{T2,OP}/V_{T2,CL}$ and $V_{MAINS}$ are all alternated voltages at the same Mains frequency, thus a time slot corresponding to a period (or sub-period) of the Mains frequency is preferably set.

According to an embodiment of the present invention, the control unit 210 determines/infers dispersion of electric power towards ground if, in the closed configuration:

$$\underline{V}_{A1}+V_{TH1} \geq \underline{V}_{T2,CL} \qquad (I)$$

i.e., if the peak value $\underline{V}_{A1}$ of the voltage $V_{A1}$ exceeds the peak value $\underline{V}_{T2,CL}$ of the voltage $V_{T2,CL}$ at least by a predefined threshold value $V_{TH}$—the threshold value $V_{TH1}$ denoting the desired sensibility which the control unit 210 is required to be provided with for determining the dispersion of electric power towards ground.

According to an embodiment of the present invention, the control unit 210 determines dispersion of electric power towards ground if, in the opened configuration:

$$\begin{cases} \underline{V}_{A1}+V_{TH2} > \underline{V}_{MAINS} \\ \underline{V}_{A1}+V_{TH3} > \underline{V}_{T2,OP} \end{cases} \qquad (II)$$

i.e. if the peak value $\underline{V}_{A1}$ of the voltage $V_{A1}$ exceeds the peak value $\underline{V}_{MAINS}$ of the voltage $V_{MAINS}$ at least by a predefined further threshold value $V_{TH2}$ and the peak value $\underline{V}_{T2,OP}$ of the voltage $V_{T2,OP}$ at least by another predefined threshold value $V_{TH3}$—the threshold values $V_{TH2}$ and $V_{TH3}$ denoting, as before, the desired sensibility for determining the dispersion of electric power towards ground.

Without losing of generality, the threshold values $V_{TH2}$ and $V_{TH3}$ may have same, similar or different values with respect to each other, as well as with respect to the threshold value $V_{TH1}$.

According to another embodiment of the present invention, the control unit 210 detects only the voltage $V_{A1}$ and the voltage $V_{MAINS}$, and extracts only the pick value $\underline{V}_{A1}$ and the pick value $\underline{V}_{MAINS}$, respectively. This can occur, for example, when detection of the voltage $V_{T2,OP}/V_{T2,CL}$ is not required (as due to cost reduction) or possible (e.g., due to monitoring errors). In such scenario, the control unit 210 determines/infers dispersion of electric power towards ground if, in the closed configuration:

$$\underline{V}_{A1}+V_{TH4} < \underline{V}_{MAINS} \qquad (III)$$

i.e., if the peak value $\underline{V}_{A1}$ of the voltage $V_{A1}$ exceeds the peak value $\underline{V}_{MAINS}$ of the voltage $V_{MAINS}$ at least by a predefined further threshold value $V_{TH4}$—the threshold value $V_{TH4}$ denoting, as before, the desired sensibility for determining the dispersion of electric power towards ground, and according to the specific implementation, may have same, similar or different value with respect to the threshold values $V_{TH1}, V_{TH2}, V_{TH3}$.

Due to anode terminal $A_1$/load terminal $T_2$ electric coupling, the formulas (I), (II) and (III) also mean that dispersion of electric power towards ground of the motor assembly 205 can be determined/inferred according to the current voltage drop across the motor assembly 205. Such formulas (I), (II) (III) have valid basis: motor assembly 205 voltage drop under normal conditions is expected to vary over nominal values when dispersion phenomena affect it. Anyway, as voltage drop variations of the motor assembly 205 also affect the current that is expected to pass through the triac 215, and typically the triac 215 current is a measure already available for other purposes (e.g., for monitoring triac operation), dispersion of electric power towards ground could also be determined based both on the formulas (I), (II) (III) and the triac 215 current. By way of example only, detection of the voltages $V_{A1}$, $V_{MAINS}$ and/or $V_{T2,OP}/V_{T2,CL}$, as well as corresponding extraction of the pick values $\underline{V}_{A1}$, $\underline{V}_{MAINS}$ and/or $\underline{V}_{T2,OP}/\underline{V}_{T2,CL}$ thereof and following comparison based on the formulas (I), (II) (III) could be performed only upon detection of predefined variations of triac 215 current. As should be readily understood, this would allow reducing processing burden of the control unit, as the heaviest operations (i.e., detection of voltages $V_{A1}$, $V_{MAINS}$ and/or $V_{T2,OP}/V_{T2,CL}$, extraction of the pick values $\underline{V}_{A1}$, $\underline{V}_{MAINS}$ and/or $\underline{V}_{T2,OP}/\underline{V}_{T2,CL}$ and comparison therebetween) are performed only when necessary.

As soon as one of the formulas (I), (II) or (III) is verified, the control unit 210 determines/infers dispersion of electric power towards ground in the motor assembly 205, and performs corresponding safety operations (e.g., alert signaling, motor assembly 205 quick halting, triac 215 and/or door lock device 230 switching off).

As should be readily understood, the dispersion of electric power towards ground so inferred is irrespective of the dispersion cause (which makes the proposed solution very advantageous over prior arts focusing on sensing of a certain electrical quantity despite of other ones), and of dispersion direction (for example, in case of a leakage current, irrespective of whether it leaks towards line terminal $T_L$ or neutral terminal $T_N$).

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

Moreover, analogous considerations apply if the electric appliance has a different structure or comprises equivalent components, or it has other operating features. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries.

Moreover, although in the present description explicit reference has been made to a triac, this should not be construed limitatively. Indeed, any driving element (intended in its widest meaning of any group of electric, electro-mechanic and/or electronic components carrying out functions related to the driving of the electric load) can be used for determination of dispersion phenomena.

A plurality of different or equivalent electric loads can be provided, each one individually and selectively controlled/driven by means of additional switching/driving elements (e.g., properly controlled by the control unit, or by dedicated processing/control units). However, in case of many electric loads, shared switching/driving elements may be provided.

The switching elements are not necessarily relays, but also, for example, electronic switches such as power (BJT, MOS, and the like) transistors, as well as they can be in any number. Moreover, the arrangement of the switching elements herein described is not strictly necessary, and several modifications are possible; in this respect, the switching elements may be arranged and/or distributed differently in the circuit system.

As should be readily understood, detection of the electrical quantities can be implemented in any useful way. For example, it is possible to provide sensing resistors (e.g., arranged in series or parallel configurations), and/or other electric elements, for example according to the provided electrical quantity to be detected. Indeed, the electrical quantities may comprise voltages (as exemplarily described in the present description), and/or currents. In this respect, current mirrors for taking such currents and properly processing it can also be provided within the control unit (or external thereto).

Although in the present description explicit reference has been made to a motor assembly, this should not be construed limitatively. Indeed, the principles of the present invention for determining dispersion of electric power towards ground also apply to other electric loads downstream the door lock device, such as heating elements for causing treatment fluids (e.g., water-based cleaning solutions, rinsing water and/or air) to be heated, electro-hydraulic components (such as valves for causing the treatment fluids to be loaded and discharged during the washing/drying cycle), pumps, compressors, and the like.

Finally, the solution according to an embodiment of the invention lends itself to be implemented through an equivalent method (by using similar steps, removing some steps being not essential, or adding further optional steps); moreover, the steps may be performed in different order, concurrently or in an interleaved way (at least partly).

The invention claimed is:

1. An electric appliance comprising:
   an electric load;
   a driving element for selectively energizing and de-energizing the electric load, the driving element having a first driving terminal ($A_1$) coupled to a first load terminal ($T_1$) of the electric load, a second driving terminal ($A_2$) coupled to a first power supply terminal ($T_N$), and a control terminal (G) for switching on and off the driving element to energize and de-energize the electric load, respectively;
a switching element for selectively coupling a second power supply terminal ($T_L$) to a second load terminal ($T_2$) of the electric load;
a coupling element coupling the first driving terminal ($A_1$) to the second load terminal ($T_2$); and
a control unit coupled to the first driving terminal ($A_1$), and to at least one of the second load terminal ($T_2$) and the second power supply terminal ($T_L$), the control unit being configured for:
determining a first value of a first electrical quantity ($V_{A1}$) at the first driving terminal ($A_1$);
determining a second value of a second electrical quantity ($V_{T2,CL}$, $V_{T2,OP}$, $V_{MAINS}$) at one of the second load terminal ($T_2$) and the second power supply terminal ($T_L$); and
determining, based on the first value of the first electrical quantity ($V_{A1}$) and the second value of a second electrical quantity ($V_{T2,CL}$, $V_{T2,OP}$, $V_{MAINS}$), that there is dispersion of electric power towards ground in the electric load.

2. The electric appliance according to claim 1, wherein the control unit is configured for:
comparing the first value of the first electrical quantity ($V_{A1}$) to the second value of the second electrical quantity ($V_{12,CL}$, $V_{T2,OP}$, $V_{MAINS}$), and
determining that there is dispersion of electric power towards ground in the electric load according to a result of the comparing.

3. The electric appliance according to claim 2,
wherein the determining the first value of the first electrical quantity ($V_{A1}$) at the first driving terminal ($A_1$) comprises extracting a first pick value ($V_{A1}$) among values of electrical quantities at the first driving terminal ($A_1$),
wherein the determining the second value of the second electrical quantity ($V_{T2,CL}$, $V_{T2,OP}$, $V_{MAINS}$) comprises extracting a second pick value ($V_{T2,CL}$, $V_{T2,OP}$, $V_{MAINS}$) among values of electrical quantities at one of the second load terminal ($T_2$) and the second power supply terminal ($T_L$), and
wherein the comparing comprises comparing the first pick value ($V_{A1}$) to the second pick value ($V_{T2,CL}$, $V_{T2,OP}$, $V_{MAINS}$).

4. The electric appliance according to claim 3,
wherein the switching element is operable to allow and prevent electrical coupling between the second load terminal ($T_2$) and the second power supply terminal ($T_L$) according to a closed configuration and an opened configuration, respectively, of an appliance door,
wherein the extracting the second pick value ($V_{12,CL}$, $V_{T2,OP}$) comprises taking a first peak value ($V_{T2,CL}$) indicative of the closed configuration, or a second peak value ($V_{T2,OP}$) indicative of the opened configuration.

5. The electric appliance according to claim 4, wherein in the closed configuration:
said comparing comprises:
comparing the first pick value ($V_{A1}$) to the first peak value ($V_{T2,CL}$), and
said determining comprises:
determining that there is dispersion of electric power towards ground in the electric load if the first pick value ($V_{A1}$) exceeds the first peak value ($V_{T2,CL}$) at least by a first threshold value ($V_{TH1}$).

6. The electric appliance according to claim 5, wherein in the opened configuration:
said comparing comprises:
comparing the first pick value ($V_{A1}$) to the second peak value ($V_{T2,OP}$); and
comparing the first pick value ($V_{A1}$) to a third peak value ($V_{MAINS}$) of electrical quantities ($V_{MAINS}$) at the second power supply terminal ($T_L$), and
said determining comprises:
determining that there is dispersion of electric power towards ground in the electric load if the first pick value ($V_{A1}$) exceeds the second peak value ($V_{T2,OP}$) at least by a second threshold value ($V_{TH2}$) and exceeds the third peak value ($V_{MAINS}$) at least by a third threshold value ($V_{TH3}$).

7. The electric appliance according to claim 6, wherein
in the closed configuration, the second power supply terminal ($T_L$) and the second load terminal ($T_2$) are substantially short-circuited to each other so that the first peak value ($V_{T2,CL}$) substantially equals the third peak value ($V_{MAINS}$), and
in the opened configuration, the second power supply terminal ($T_L$) and the second load terminal ($T_2$) are substantially isolated from each other so that the second peak value ($V_{T2,OP}$) is lower than the third peak value ($V_{MAINS}$).

8. The electric appliance according to claim 4, wherein in the opened configuration:
said comparing comprises:
comparing the first pick value ($V_{A1}$) to the second peak value ($V_{T2,OP}$);and
comparing the first pick value ($V_{A1}$) to a third peak value ($V_{MAINS}$) of electrical quantities ($V_{MAINS}$) at the second power supply terminal ($T_L$), and
said determining comprises:
determining that there is dispersion of electric power towards ground in the electric load if the first pick value ($V_{A1}$) exceeds the second peak value ($V_{T2,OP}$) at least by a second threshold value ($V_{TH2}$) and exceeds the third peak value ($V_{MAINS}$) at least by a third threshold value ($V_{TH3}$).

9. The electric appliance according to claim 8, wherein:
in the closed configuration, the second power supply terminal ($T_L$) and the second load terminal ($T_2$) are substantially short-circuited to each other so that the first peak value ($V_{T2,CL}$) substantially equals the third peak value ($V_{MAINS}$), and
in the opened configuration, the second power supply terminal ($T_L$) and the second load terminal ($T_2$) are substantially isolated from each other so that the second peak value ($V_{T2,OP}$) is lower than the third peak value ($V_{MAINS}$).

10. The electric appliance according to claim 3, wherein said comparing comprises:
comparing the first pick value ($V_{A1}$) to the second pick value ($V_{MAINS}$) among the electrical quantities at the second power supply terminal ($T_L$), and
said determining comprises:
determining that there is dispersion of electric power towards ground in the electric load if the first pick value ($V_{A1}$) exceeds the second pick value ($V_{MAINS}$) at least by a threshold voltage ($V_{TH4}$).

11. The electric appliance according to claim 1, wherein the driving element comprises a triac.

12. The electric appliance according to claim 1, wherein the electric load comprises an electric motor.

13. The electric appliance according to claim 1, wherein the electric appliance comprises a washing machine, a drying machine, or a washing/drying machine.

14. The electric appliance according to claim 11, wherein the electric appliance comprises a rotating drum adapted to house laundry to be washed and/or dried, and wherein the electric load comprises an electric motor for drum rotation.

15. The electric appliance according to claim 1,
wherein the control unit is directly coupled to the first driving terminal ($A_1$) such that a voltage at the first driving terminal ($A_1$) substantially equals a voltage at a first input of the control unit, and
wherein the control unit is directly coupled to at least one of the second load terminal ($T_2$) and the second power supply terminal ($T_L$) such that a voltage at the second load terminal ($T_2$) substantially equals a voltage at a second input of the control unit or a voltage at the second power supply terminal ($T_L$) substantially equals a voltage at a third input of the control unit.

16. The electric appliance according to claim 1, wherein the determining the first value of the first electrical quantity ($V_{A1}$) at the first driving terminal ($A_1$) and the determining the second value of the second electrical quantity ($V_{T2,CL}$, $V_{T2,OP}$, $V_{MAINS}$) at one of the second load terminal ($T_2$) and the second power supply terminal ($T_L$) are responsive to a detection of a predefined variation of a current of the driving element.

17. A method for determining whether there is dispersion of electric power towards ground in an electric appliance comprising:
an electric load;
a driving element for selectively energizing and de-energizing the electric load, the driving element having a first driving terminal ($A_1$) coupled to a first load terminal ($T_1$) of the electric load, a second driving terminal ($A_2$) coupled to a first power supply terminal ($T_N$), and a control terminal (G) for switching on and off the driving element to energize and de-energize the electric load, respectively; and
a switching element for selectively coupling a second power supply terminal ($T_L$) to a second load terminal ($T_2$) of the electric load; and
a control unit configured for controlling the driving element and the switching element (230),
wherein the method comprises, under control of the control unit, the following steps:
determining a first value of a first electrical quantity ($V_{A1}$) at the first driving terminal ($A_1$);
determining a second value of a second electrical quantity ($V_{T2,CL}$, $V_{T2,OP}$, $V_{MAINS}$) at one of the second load terminal ($T_2$) and the second power supply terminal ($T_L$);
comparing the first value of the first electrical quantity ($V_{A1}$) to the second value of the second electrical quantity ($V_{T2,CL}$, $V_{T2,OP}$, $V_{MAINS}$); and
determining that there is dispersion of electric power towards ground in the electric load according to a result of the comparing.

18. The method according to claim 17,
wherein the determining the first value of the first electrical quantity ($V_{A1}$) at the first driving terminal ($A_1$) comprises extracting a first pick value ($V_{A1}$) among values of electrical quantities at the first driving terminal ($A_1$),
wherein the determining the second value of the second electrical quantity ($V_{T2,CL}$, $V_{T2,OP}$, $V_{MAINS}$) comprises extracting a second pick value ($V_{T2,CL}$, $V_{T2,OP}$, $V_{MAINS}$) among values of electrical quantities at one of the second load terminal ($T_2$) and the second power supply terminal ($T_L$), and
wherein said comparing comprises:
comparing the first pick value ($V_{A1}$) to the second pick value ($V_{T2,CL}$, $V_{T2,OP}$, $V_{MAINS}$).

19. The method according to claim 18, wherein the extracting the second pick value ($V_{T2,CL}$, $V_{T2,OP}$) comprises taking a first peak value ($V_{T2,CL}$) indicative of a closed configuration of an appliance door, or a second peak value ($V_{T2,OP}$) indicative of an opened configuration of the appliance door, and wherein in the closed configuration:
said comparing comprises:
comparing the first pick value ($V_{A1}$) to the first peak value ($V_{T2,CL}$), and
said determining comprises:
determining that there is dispersion of electric power towards ground in the electric load if the first pick value ($V_{A1}$) exceeds the first peak value ($V_{T2,CL}$) at least by a first threshold value ($V_{TH1}$).

20. The method according to claim 19, wherein in the opened configuration:
said comparing comprises:
comparing the first pick value ($V_{A1}$) to the second peak value ($V_{T2,OP}$);and
comparing the first pick value ($V_{A1}$) to a third peak value ($V_{MAINS}$) of electrical quantities ($V_{MAINS}$) at the second power supply terminal ($T_L$), and
said determining comprises:
determining that there is dispersion of electric power towards ground in the electric load if the first pick value ($V_{A1}$) exceeds the second peak value ($V_{T2,OP}$) at least by a second threshold value ($V_{TH2}$) and exceeds the third peak value ($V_{MAINS}$) at least by a third threshold value ($V_{TH3}$).

* * * * *